(12) United States Patent
Lee

(10) Patent No.: US 7,906,814 B2
(45) Date of Patent: Mar. 15, 2011

(54) FIN FIELD EFFECT TRANSISTOR HAVING LOW LEAKAGE CURRENT AND METHOD OF MANUFACTURING THE FINFET

(75) Inventor: Jong Ho Lee, Daegu (KR)

(73) Assignee: SNU R&DB Foundation, Seoul (KR)

( * ) Notice: Subject to any disclaimer, the term of this patent is extended or adjusted under 35 U.S.C. 154(b) by 213 days.

(21) Appl. No.: 12/310,532

(22) PCT Filed: Aug. 27, 2007

(86) PCT No.: PCT/KR2007/004111
§ 371 (c)(1),
(2), (4) Date: Feb. 27, 2009

(87) PCT Pub. No.: WO2008/026859
PCT Pub. Date: Mar. 6, 2008

(65) Prior Publication Data
US 2010/0270619 A1    Oct. 28, 2010

(30) Foreign Application Priority Data

Sep. 1, 2006   (KR) .......................... 10-2006-0084370

(51) Int. Cl.
*H01L 29/76* (2006.01)
(52) U.S. Cl. .. 257/365; 257/353; 257/401; 257/E29.137; 257/E29.264; 257/E29.275
(58) Field of Classification Search .................. 257/365, 257/353, 401, 618, E29.137, E29.264, E29.275
See application file for complete search history.

(56) References Cited

U.S. PATENT DOCUMENTS

| | | | | |
|---|---|---|---|---|
| 6,635,909 B2 * | 10/2003 | Clark et al. | .................... | 257/192 |
| 6,869,868 B2 * | 3/2005 | Chiu et al. | .................... | 438/592 |
| 7,361,958 B2 * | 4/2008 | Brask et al. | .................... | 257/369 |
| 2005/0104096 A1 * | 5/2005 | Lee et al. | ....................... | 257/288 |

* cited by examiner

*Primary Examiner* — Tu-Tu V Ho
(74) *Attorney, Agent, or Firm* — The Nath Law Group; Jerald L. Meyer; Jiaxiao Zhang

(57) ABSTRACT

Provided is a fin field effect transistor (FinFET) having low leakage current and a method of manufacturing the same. The FinFET includes: a bulk silicon substrate; a fence-shaped body formed by patterning the substrate; an insulating layer formed on a surface of the substrate to a first height of the fence-shaped body; a gate insulating layer formed at side walls and an upper surface of the fence-shaped body at which the insulating layer is not formed; a gate electrode formed on the gate insulating layer; source/drain formed at regions of the fence-shaped body where the gate electrode is not formed. The gate electrode includes first and second gate electrodes which are in contact with each other and have different work functions. Particularly, the second gate electrode having a low work function is disposed to be close to the drain. As a result, the FinFET according to the present invention increases a threshold voltage by using a material having the high work function for the gate electrode and lowers the work function of the gate electrode overlapping with the drain, so that gate induced drain leakage (GIDL) can be reduced.

17 Claims, 12 Drawing Sheets

(a)  (b)

FIG. 6
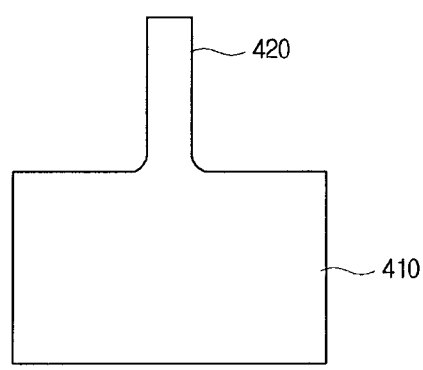
(a)
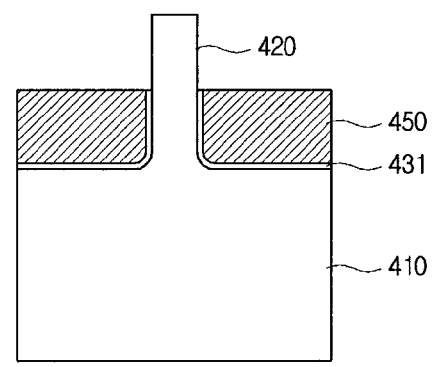
(b)
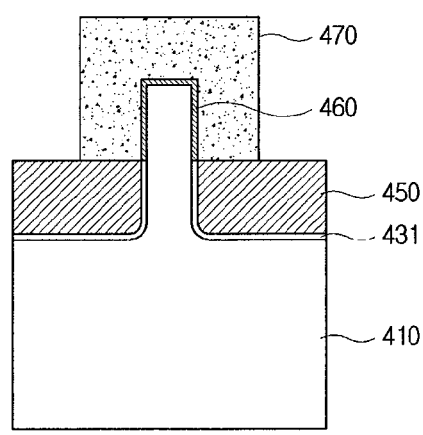
(c)
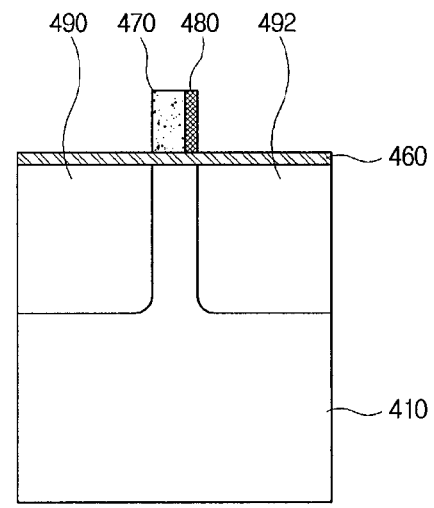
(d)

(a)　　　　　　　　　　　(b)

FIN FIELD EFFECT TRANSISTOR HAVING LOW LEAKAGE CURRENT AND METHOD OF MANUFACTURING THE FINFET

TECHNICAL FIELD

The present invention relates to a fin field effect transistor (FinFET) having low leakage current, and more particularly, to a FinFET and a method of manufacturing the FinFET which is formed on a bulk silicon substrate as a high density dynamic random access memory (DRAM) cell device, and has a gate electrode made of two materials having different work functions so as to reduce a work function of a region of the gate electrode that overlaps with a drain region, thereby reducing gate induced drain leakage (GIDL).

BACKGROUND ART

Dynamic random access memory (DRAM) technology is a core technology that occupies a large part of a silicon semiconductor market. Throughout the world, research on the next-generation DRAM has been actively carried out, and a higher density DRAM has been developed. Particularly, in order to reduce a size of a cell and increase a density, a gate length of a DRAM cell device is decreased. Reduction of the size of the cell device has a problem of the short channel effect. Due to the short channel effect, there is a problem in that drain current increases in an OFF state.

A metal-oxide-semiconductor field-effect transistor (MOSFET) according to a related art has a channel structure formed on a flat surface in which source/drain regions are formed at both sides of the channel. When the MOSFET having the conventional flat channel is applied to a DRAM technology using a 100 or less nm process, the short channel effect occurs in the MOSFET. In order to reduce a size of the MOSFET, conventionally, gate insulating layer thickness reduction, source/drain junction depth reduction, and channel doping density increase have to be followed. Since the gate length is decreased, a thickness of the gate insulating layer cannot be reduced as compared with a conventional logic MOSFET due to characteristics of the DRAM cell device. In addition, a depth of the source/drain cannot be relatively shortened, and this is an obstacle to reduce the size of the cell device. In addition, in order to prevent drain induced barrier lowering (DIBL) due to the reduction of the size of the cell, the doping density of the channel has to be increased. In this case, an electric field between the channel and the drain increases, and leakage current increases due to band-to-band tunneling. Off-state leakage current of drain current in the DRAM cell device has to be about 1 fA or less. Therefore, it is expected that reducing the gate length of the cell device of the MOSFET having the conventional flat channel to be about 70 nm or less is very difficult.

Research to solve the problem that occurs when a device having the conventional flat channel structure is used as the DRAM cell device has been actively carried out. A direction of the research is to develop and apply a three-dimensional device structure or a device structure having a channel that is not flat any more to the cell device. A representative device considered as the DRAM cell device is a device having a recessed channel structure and a bulk FinFET, and these are described as follows.

It is important for the memory cell device to reduce a cell area on a two-dimensional surface, increase on-current, and decrease off-current. The aforementioned recessed channel structure is a structure in which a length of an effective channel is increased while the two-dimensional surface area is not increased to suppress the short channel effect such as the DIBL. For example, a recessed structure for DRAM application is disclosed in a paper by Samsung Electronics in 2003 (J. Y. Kim et al., The breakthrough in data retention time of DRAM using recess-channel-array transistor (RCAT) for 88 nm feature size and beyond, in Proc. Symp. on VLSI Tech., p. 11, 2003). According to the paper, there is an advantage of significantly reducing the off-current by suppressing the short channel effect. However, there is a problem in that the on-current is significantly reduced due to a relatively long channel length and a narrow channel width. The reduction of the on-current may cause reduction of an operating speed of the DRAM. In addition, the recessed channel region may have two corners in a direction of the channel length, and when the channel doping density is changed at the corners, there is a problem in that the threshold voltage is significantly changed. Conventionally, a doping density only of the recessed channel in the device is high. However, in this case, the doping density affects the corner area. There is a worse problem in that when the recessed channel width is reduced as the size of the device is reduced, an etching profile adjacent to the recessed bottom cannot be easily controlled, and it is difficult to uniformly control the recessed channel depth. In addition, as the recessed channel width is reduced, sensitivity of the threshold voltage according to a change in the etching profile adjacent to the recessed bottom increases. Since the structure of the channel of the recessed channel device is concave, back-bias effects heavily occur. In addition, for negative substrate bias, an n-channel MOSFET (NMOS) has a problem in that a threshold voltage is significantly increased as compared with the flat channel. The recessed channel device has characteristics in that control ability of the gate electrode for the channel is degraded as compared with the flat channel device, and this is associated with the high substrate bias effects.

A structure having good control ability of the gate electrode for the channel is a double/triple-gate MOS structure. However, it is impossible to apply the double/triple-gate device implemented on a silicon on insulator (SOI) (referred to as SOI FinFET) as the DRAM cell device due to device characteristics. A body-tied double/triple-gate MOSFET having high practicality (see Korean Patent Registration No. 0458288, Korean Patent Registration No. 0471189, U.S. Patent Registration No. 6885055, Japanese Patent Application No. 2003-298051, U.S. patent application Ser. No. 10/358,981, Japanese Patent Application No. 2002-381448) is first published by the present inventor, and the present inventor called the structure a bulk FinFET. In the aforementioned structure, the channel is not recessed, and a channel is formed at an upper surface and both side surfaces of an active fence-shaped body, or a channel is formed to be adjacent to both side surfaces of a fence-shaped body. Therefore, the control ability of the gate for the channel is better than that of the conventional flat channel device. Therefore, the device has good ability to suppress the short channel effect and has low DIBL, and this is advantageous to reduction of the device size. In addition, the gate electrode has good control ability for the channel, so that there are hardly substrate bias effects. In terms of a two-dimensional surface, an area occupied by the cell is small, and an effect channel width is properly large, so that on-current increases, and this results in increase of the operating speed of the DRAM. When the bulk FinFET structure is applied to the DRAM cell device, there are many advantages.

However, when an n$^+$ polycrystalline silicon gate is applied to a conventional n-type FinFET, a threshold voltage of the device is low, so that there is a disadvantage in that current in the OFF state increases. When a channel doping density is increased in order to increase the threshold voltage, leakage current due to band-to-band tunneling between a drain and the channel is increased, so that increasing the channel doping density is not effective. In order to solve the aforementioned problem, a negative wordline method may be applied. However, in this case, there are problems in that the negative wordline method is not general and peripheral circuits become complex. In order to increase the threshold voltage, a work function of the gate may be changed from $n^+$ to $p^+$. However, in this case, band bending increases at a drain region which overlaps with a gate electrode, so that there are problems in that GIDL is increased, and off-current is increased.

Therefore, the present assignee proposes a structure of the present invention in order to solve the aforementioned problems that occur when the conventional FinFET is applied to the DRAM.

When an SOI substrate is used to implement the FinFET, there are disadvantages in that the SOI substrate has more defects and more expensive than the bulk silicon substrate. The FinFET implemented on the SOI substrate has a floating body problem that is the problem of the conventional SOI device. In addition, a buried oxide (BOX) formed on the SOI substrate blocks heat generated from the device to be transferred to the substrate, so that characteristics of the device may be degraded. In addition, in the FinFET implemented on the SOI substrate, leakage current may increase due to the defects, so that the FinFET implemented on the SOI may not be applied to the DRAM which is sensitive to leakage current.

In order for the bulk FinFET to have DIBL of about 100 mV/V or less, a width of the body having a desired nano size has to be two-thirds of a gate length. Needless to say, the DIBL of the DRAM cell device has to be much smaller than 100 mV/V. Therefore, the width of the body is significantly reduced.

When the width of the body in the FinFET is reduced and the $n^+$ polycrystalline silicon is used as the gate electrode, the threshold voltage is decreased. Therefore, when the gate voltage is 0V, drain current, that is, off-current increases. In order to solve the problem, a work function of the gate electrode has to be larger than that of the $n^+$ polycrystalline silicon. For example, when it is changed into a $p^+$ polycrystalline silicon gate, the threshold voltage is increased. Therefore, a threshold voltage required by the conventional DRAM can be obtained.

However, in this case, there is a problem in that GIDL per channel width increases at a given surface, and this results in decrease of a refresh time of the DRAM cell. There are two reasons why the GIDL increases. First, the $p^+$ polycrystalline silicon or a gate having a high work function is used instead of the $n^+$ polycrystalline silicon, so that the band structure is changed. Second, an effective area where a gate electrode and a drain per given surface area according to the FinFET device structure overlap is increased.

First, a case where the $p^+$ polycrystalline silicon gate is used instead of the $n^+$ polycrystalline gate to increase the GIDL is described. When the cell device is the NMOS, the $p^+$ polycrystalline silicon gate which overlaps with an $n^+$ drain has a work function higher than that of the $n^+$ drain by a silicon energy band gap. When an equilibrium state in which gate bias is 0V is examined, an energy band of the drain region has to be tilted by the silicon band gap so that a Fermi level of the drain region is the same as that of the gate. The tilted energy band in the $n^+$ drain region that overlaps with the $p^+$ gate means existence of an electric field, and since a gradient thereof is great, electric field strength is also great. When the electric field strength is great, hole-electron pairs are produced around a surface of the drain region that overlaps with the gate, and electrons flow to the drain and drain current flows. When a drain voltage is increased, the energy band is further tilted, and leakage current due to the GIDL increases.

Next, a case where the effective area which generates the GIDL in the FinFET structure is increased is described. In the conventional flat channel, a channel width given to a two-dimensional surface becomes a practical channel width, and GIDL according to the channel width can be conventionally accepted. However, in the FinFET, in addition to the channel width given to the two-dimensional surface of the body, a channel is formed at a portion of both side surfaces thereof, and the gate electrode and the drain overlap along the channel width. Therefore, an area that may generate GIDL increases, and GIDL per unit cell increases. In order to solve the aforementioned problem, the present invention provides a device structure in which a work function of the gate electrode of the double/triple-gate MOSFET or FinFET is changed.

Hereinafter, a paper associated with a gate work function in double-gate structures according to a related art is described.

FIG. 1 illustrates a conventional device structure (see: S. Tiwari et al., International Electron Device Meeting, pp. 737-740, 1998). The device has an SOI structure in which a side gate 8 having a different work function is directly attached to a side surface of a main gate 7 and has a double-gate structure in which a gate having the same work function as that of the main gate 7 is disposed under a silicon film 20. In this structure, there is a disadvantage in that the side gate 8 is formed in a spacer shape and a practical gate length is increased. Particularly, the SOI device structure is not appropriate to be applied to a device that is sensitive to leakage current such as the DRAM. A lower gate is made of a material having the same work function as that of the main gate 7. This structure is proposed not to reduce the GIDL but suppress the short channel effect and increase a performance of the device.

FIG. 2 illustrates a double/gate device structure implemented on an SOI substrate (see: G. V. Reddy et al., IEEE Trans. on Nanotechnology, vol. 4, no. 2, pp. 260-268, March 2005) as a conventional device structure. In this structure, half an upper gate includes a main gate 7 having a high work function, and the other half thereof includes a gate 8 having a low work function. A lower gate includes a gate 8 having a low work function. The upper gate is originally made of $p^+$ polycrystalline silicon. However, the half of the upper gate is changed into $n^+$ to further suppress the short channel effect. In this paper, the SOI substrate is used as illustrated in FIG. 1. In addition, a single gate structure in which the upper gate is made of two materials having different work functions and the lower gate is doped with $n^+$ is applied. Since the lower gate is $n^+$, a threshold voltage is low, and therefore, the structure cannot be applied to the DRAM.

FIG. 3a illustrates a conventional device structure (see: S. Han et al., IEEE Trans. on Electron Devices, vol. 48, no. 9, pp. 2058-2064, September 2005) in which a gate 8 having a low work function is isolated from a gate 7 having a high work function by an insulating layer 10. The gate 8 can easily abandon a channel to a lower channel, so that an electrically abandoned inversion layer functions as a lightly doped drain (LDD). Since a channel structure is a flat channel structure, the channel structure has problems of the conventional flat channel structure. In addition, in the structure, GIDL needs not be reduced, and there is no associated description.

FIG. 3b illustrates a conventional device structure having a double-gate structure (see: A. A. Orouji et al., IEEE Trans. on Device and Materials Reliability, vol. 5, no. 3, pp. 509-514, September 2005). As the double-gate, a lower gate is an $n^+$ gate, and an upper gate includes a $p^+$ as a main gate and an $n^+$ side gate electrically insulated from the main gate. In this document, it is described that the gate electrode structure is applied to improve the short channel effect and suppress generation of hot carriers. However, the structure is formed on the SOI substrate, the structure has problems of the SOI device. In addition, the side gate having a low work function of the upper gate is electrically isolated from the main gate having a high work function, so that there is a problem in that an area of the device is increased in the device manufacturing process.

DISCLOSURE

Technical Problem

The present invention provides a fin field effect transistor (FinFET) which has good size-reduction characteristics and minimizes leakage current in an OFF state so as to be used as a high density dynamic random access memory (DRAM) cell.

The present invention also provides a FinFET using a bulk silicon substrate having a structure in which a threshold voltage is increased and gate induced drain leakage (GIDL) is reduced.

The present invention also provides a method of manufacturing the aforementioned FinFET.

Technical Solution

According to an aspect of the present invention, there is provided a fin field effect transistor (FinFET) having low leakage current including: a bulk silicon substrate; a fence-shaped body which is formed by patterning the substrate and has a shape of a fence having predetermined height, width, and length; an insulating layer which is made of an insulating material and is formed on a surface of the substrate to a first height of a fence-shaped body; a gate insulating layer formed at side walls and an upper surface of the fence-shaped body protruding from the insulating layer; a gate electrode formed on the gate insulating layer and the insulating layer to be perpendicular to a direction of the length of the fence-shaped body; and source/drain regions formed at regions where the gate electrode is not formed on the fence-shaped body, wherein the gate electrode includes a first gate electrode and a second gate electrode electrically connected to the first gate electrode, the second gate electrode has a work function lower than that of the first gate electrode, and the second gate electrode is formed at a side surface of the first gate electrode to be close to the drain region.

According to a second aspect of the present invention, there is provided a FinFET having low leakage current including: a bulk silicon substrate; a fence-shaped body which is formed by patterning the substrate and has a shape of a fence having predetermined height, width, and length; an insulating layer which is made of an insulating material and is formed on a surface of the substrate to a first height of a fence-shaped body; a gate insulating layer formed at side walls and an upper surface of the fence-shaped body protruding from the insulating layer; a gate electrode formed on the gate insulating layer and the insulating layer to be perpendicular to a direction of the length of the fence-shaped body; and source/drain regions formed at regions where the gate electrode is not formed on the fence-shaped body, wherein the gate electrode includes a first gate electrode, a second gate electrode, and an isolation insulating layer disposed between the first and second gate electrodes, the second gate electrode has a work function lower than that of the first gate electrode, and the second gate electrode is formed at a side surface of the first gate electrode interposing the isolation insulating layer to be close to the drain region.

According to a third aspect of the present invention, there is provided a FinFET having low leakage current including: a bulk silicon substrate; a fence-shaped body which is formed by patterning the substrate and has a shape of a fence having predetermined height, width, and length; an insulating layer which is made of an insulating material and is formed on a surface of the substrate to a first height of a fence-shaped body; a gate insulating layer formed at side walls and an upper surface of the fence-shaped body protruding from the insulating layer; a gate electrode formed on the gate insulating layer and the insulating layer to be perpendicular to a direction of the length of the fence-shaped body; and source/drain regions formed at regions where the gate electrode is not formed on the fence-shaped body, wherein the gate electrode includes a first gate electrode and second gate electrodes formed at both side surfaces of the first gate electrode, the second gate electrodes have work functions lower than that of the first gate electrode, and the second gate electrodes are formed at the both side surfaces of the first gate electrode to be close to the source/drain regions, respectively.

According to a fourth aspect of the present invention, there is provided a FinFET having low leakage current including: a bulk silicon substrate; a fence-shaped body which is formed by patterning the substrate and has a shape of a fence having predetermined height, width, and length; an insulating layer which is made of an insulating material and is formed on a surface of the substrate to a first height of a fence-shaped body; a gate insulating layer formed at side walls and an upper surface of the fence-shaped body protruding from the insulating layer; a gate electrode formed on the gate insulating layer and the insulating layer to be perpendicular to a direction of the length of the fence-shaped body; and source/drain regions formed at regions where the gate electrode is not formed on the fence-shaped body, wherein the gate electrode includes a first gate electrode, second gate electrodes formed at both side surfaces of the first gate electrode, respectively, and isolation insulating layers disposed between the first gate electrode and the second gate electrodes, respectively, the second gate electrodes have work functions lower than that of the first gate electrode, and the second gate electrodes are formed at the both side surfaces of the first gate electrode to be close to the source/drain regions, respectively.

In the first, second, third, and fourth aspects of the present invention, the insulating layer may include: a thermal oxide layer formed on the substrate and the side surfaces of the fence-shaped body; and a device isolating layer deposited on the thermal oxide layer to electrically isolate a corresponding device from an adjacent device.

In the first, second, third, and fourth aspects of the present invention, the insulating layer may include: a thermal oxide layer formed on the substrate and the side surfaces of the fence-shaped body; a nitride layer formed on the thermal oxide layer; and a field insulating layer deposited on an upper portion of the nitride layer to electrically isolate a corresponding device from an adjacent device.

In the first, second, third, and fourth aspects of the present invention, the fence-shaped body may have a rounded corner at the upper surface of the fence-shaped body.

In addition, the width of the fence-shaped body from the surface of the fence-shaped body to the substrate may be constant, the width of the fence-shaped body may increase in a direction from the upper surface of the fence-shaped body to the substrate, or the width of the fence-shaped body may be constant to the first height from the upper surface and increase in a direction from the firth height to the substrate.

In addition, a height of a side channel formed at the side surface of the fence-shaped body may range from 2 to 200 nm.

In the first, second, third, and fourth aspects of the present invention, a thickness of the gate insulating layer formed at the side surfaces of the fence-shaped body may range from 0.5 to 10 nm, a thickness of the gate insulating layer formed at the upper surface of the fence-shaped body may range from 0.5 to 200 nm.

In addition, a thickness of the gate insulating layer formed on the side surfaces and the upper portion of the fence-shaped body may range from 0.5 to 200 nm at an internal channel, and the thickness of the channel may increase in directions to the source/drain so as to range 0.6 to 201 nm.

In the first, second, third, and fourth aspects of the present invention, a depth of the source/drain regions may range from 10 to 500 nm from the upper surface of the fence-shaped body.

In the first, second, third, and fourth aspects of the present invention, the width of the fence-shaped body may be entirely uniform, the width of the fence-shaped body in regions where the source/drain excluding a region where the gate electrode crosses are formed may be larger or smaller than the width of the fence-shaped body in a region where the gate electrode crosses, or the width of the fence-shaped body in the regions where the source/drain are formed may be larger than the width of the fence-shaped body in the region where the gate electrode crosses to decrease source/drain resistance.

In the first, second, third, and fourth aspects of the present invention, the first gate electrode and the second gate electrode may be made of the same material and have different impurity doping types, made of different materials, or made of different materials and have different impurity doping types in order to have different work functions.

In addition, the gate electrode may be made of one or more of polycrystalline silicon, polycrystalline silicon-germanium, polycrystalline germanium, amorphous silicon, amorphous silicon-germanium, amorphous germanium, silicon, silicide of a semiconductor material and a metal, various types of metal oxide, metals having various work functions, binary metals such as tantalum nitride (TaN), titanium nitride (TiN), and tungsten nitride (WN).

According to a fifth aspect of the present invention, there is provided a method of manufacturing a FinFET having low leakage current, including: (a) forming a fence-shaped body on a bulk silicon substrate using monocrystalline silicon; (b) forming an insulating layer from a surface of the bulk silicon substrate to a first height of the fence-shaped body; (c) forming a gate insulating layer at side surfaces and an upper surface of the fence-shaped body above the first height; (d) forming a gate electrode including a first gate electrode and a second gate electrode that have different work functions on the insulting layer and the gate insulating layer; and (e) forming source/drain regions at a remaining region excluding a region covered by the gate electrode on the fence-shaped body.

In the fifth aspect of the present invention, (b) includes: (b1) forming a first insulating layer by performing thermal oxidation on the surfaces of the bulk silicon substrate and the fence-shaped body; (b2) forming a second insulating layer on the first insulating layer; and (b3) selectively etching the first and second insulating layers to the first height of the fence-shaped body.

In the fifth aspect of the present invention, (b) includes: (b1) forming a first insulating layer by performing thermal oxidation on the surfaces of the bulk silicon substrate and the fence-shaped body; (b2) forming a nitride layer on the first insulating layer; (b3) forming a second insulating layer on the nitride layer; and (b4) selectively etching the nitride layer and the second insulating layer to the first height of the fence-shaped body.

In the fifth aspect of the present invention, in (d), the gate electrode may be formed on the insulating layer and the gate insulating layer, and the gate electrode may include the first gate electrode and the second gate electrode connected to a side of the drain or to both side surfaces of the first gate electrode, and the second gate electrode may have a work function lower than that of the first gate electrode.

In the fifth aspect of the present invention, (a) includes: (a1) forming an oxide layer, a nitride layer, or an oxide layer and an nitride layer as a mask material on the silicon substrate; (a2) forming a mask for the fence-shaped body by patterning the mask material; and (a3) forming the fence-shaped body by etching the silicon substrate using the mask for the fence-shaped body.

In the fifth aspect of the present invention, in (c), oxide layer growth in consideration of crystallization directionality may be performed on the exposed upper surface and side surfaces of the fence-shaped body above the first height so that an oxide layer in a direction to the side surface is relatively thicker and a thickness of the gate insulating layer formed on the upper surface of the fence-shaped body is smaller than that of the gate insulating layer formed on the side surfaces of the fence-shaped body.

In the fifth aspect of the present invention, (b) and (c) include: remaining the hard mask for the fence-shaped body initially formed on the substrate surface to form the fence-shaped body in the upper portion of the fence-shaped body; sequentially forming a first insulating layer, a nitride layer, and a second insulating layer; performing planarization at a height adjacent to a surface of the nitride layer formed on the upper portion of the fence-shaped body; selectively etching the nitride layer to a first depth from the upper surface of the fence-shaped body; etching the first insulating layer at an exposed side surface to expose the side surface of the fence-shaped body; performing annealing in a state where the side surface of the fence-shaped body is exposed; and forming a gate insulating layer at the exposed upper surface and side surfaces of the fence-shaped body to be thinner than the insulating layer remaining at the upper surface of the fence-shaped body so as to allow a thickness of the gate insulating layer formed on the upper surface of the fence-shaped body is larger than that of the gate insulating layer formed on the side surfaces of the fence-shaped body.

In the fifth aspect of the present invention, (d) includes: (d1) forming a polycrystalline silicon layer for forming the gate electrode on the gate insulating layer; (d2) doping the polycrystalline silicon layer with $p^+$ having a high density; (d3) forming an insulating layer having a predetermined thickness on the doped polycrystalline silicon layer; (d4) etching and patterning the insulating layer and the polycrystalline silicon layer by using photolithography; and (d5) performing counter-doping with $n^+$ on the side surface of the polycrystalline silicon layer doped with $p^+$.

In the fifth aspect of the present invention, (d) includes: (d1) forming a polycrystalline silicon layer for forming the gate electrode on the gate insulating layer; (d2) doping the polycrystalline silicon layer with $p^+$ having a high density; (d3) forming an insulating layer having a predetermined thickness on the doped polycrystalline silicon layer; (d4) etching and patterning the insulating layer and the polycrystalline silicon layer by using a gate electrode mask; (d5)

depositing a nitride layer having a small thickness and performing anisotropic etching thereon to form a nitride spacer and cover a side surface of the polycrystalline silicon layer; (d6) growing an oxide layer having a predetermined thickness on the source/drain regions; (d7) removing the nitride layer spacer to expose a side surface of the p$^+$ polycrystalline silicon; (d8) covering the source region by using a photoresist on the basis of the center of the insulating layer formed on the polycrystalline silicon layer; and (d9) performing counter-doping with n$^+$ on the exposed side surface of the p$^+$ polycrystalline silicon.

In the fifth aspect of the present invention, (e) includes: (e1) after the gate electrode is formed performing ion implantation or plasma doping to form a lightly doped drain (LDD), or forming an insulating layer with a predetermined thickness as a spacer and performing ion implantation or plasma doping to form the LDD; (e2) forming the spacer by using the insulating layer; and (e3) performing ion implantation or plasma doping to form n$^+$ heavily doped drain (HDD) source/drain.

According to a sixth aspect of the present invention, there is provided a method of manufacturing a FinFET having low leakage current, including: (a) forming a fence-shaped body made of monocrystalline silicon on a bulk silicon substrate; (b) sequentially forming a first insulating layer and a second insulating layer on a surface of the bulk silicon substrate to a height adjacent to an upper surface of the fence-shaped body; (c) forming a third insulating layer on the surface of the fence-shaped body; (d) forming a fourth insulating layer or a semiconductor layer having selective etching property on the third insulating layer; (e) forming a photoresist pattern by using a mask for opening a gate; (f) sequentially etching the fourth insulating layer or the semiconductor layer and the third insulating layer by using the pattern; (g) vertically etching the first and second insulating layers to a predetermined depth from the surface of the body; (h) removing the photoresist pattern; (i) growing a sacrificial oxide layer at the exposed surface and a portion of side surfaces of the fence-shaped body; (j) performing channel ion implantation and annealing; (k) removing the sacrificial oxide layer and performing annealing to improve surface characteristics; (l) forming a gate insulating layer; (m) depositing a polycrystalline silicon layer for the gate electrode; (n) doping the gate electrode with p$^+$ and performing annealing; (o) remaining the gate doped with p+ only in a region for opening the gate and only in a region under the fourth insulating layer and the surface of the semiconductor layer; (p) removing the fourth insulating layer or the semiconductor layer; (q) exposing the side surface of the gate electrode by etching the first and second insulating layers to a predetermined depth from the surface of the fence-shaped body; (r) counter-doping only a side wall of the gate electrode with n$^+$ in a direction of the drain; and (s) forming source/drain regions on a remaining region of the fence-shaped body excluding a region covered by the gate electrode.

ADVANTAGEOUS EFFECTS

FIG. 15 is a graph illustrating $I_D$-$V_{GS}$ characteristics of a device according to changes in a length of the second gate electrode having a low work function in the structure of the FinFET having low leakage current illustrated in FIG. 14 according to the present invention. Referring to FIG. 15, the total gate length is 50 nm, a width d1 of the fence-shaped body is 20 nm, a side channel height d2 of the fence-shaped body is 50 nm, a substrate density is p-type $10^{17}$ cm$^{-3}$, a thickness of the gate oxide layer is 3 nm, and a drain voltage is 1.5V. In addition, p-type impurities having a peak value of $310^{18}$ cm$^{-3}$ are doped in a Gaussian function form rather below the distance d2 from the upper portion of the fence-shaped body to solve punchthrough between the source and the drain which may occur at a position lower than the upper portion of the fence-shaped body by the distance d2. As illustrated in FIG. 15, a length of the n$^+$ region having a low work function is changed from 0 to 50 nm to examine characteristics thereof. The n$^+$ region having a length of 0 means that the gate only includes the p$^+$ gate, and the n$^+$ region having a length of 50 nm means that the gate only includes the n$^+$ gate. At a region where the drain current A is $10^{-13}$ or less, due to GIDL, the drain current increases as a gate voltage is changed from positive to negative. As an important characteristic of the DRAM cell device, current in a case where the gate voltage $V_{GS}$ is 0V and the drain voltage is the maximum voltage in operating voltages is called $I_{off}$. As illustrated in results of FIG. 15, when the length of the gate electrode having a low work function is changed, a value thereof is also changed.

FIG. 16 is a graph illustrating the $I_{off}$ current for the device described with reference to FIG. 15 according to an n$^+$ gate length. Structures and bias conditions of all devices are the same as those in FIG. 15. As illustrated in FIG. 16, the $I_{off}$ current has the minimum value when the n$^+$ gate length in the gate electrode having the total length of 50 nm is about 15 nm. As described above, when the gate structure according to the present invention is used, the $I_{off}$ current due to GIDL in the bulk FinFET having a high density can be reduced, so that the bulk FinFET can be used as the DRAM cell device having a gate length of 50 nm or less.

DESCRIPTION OF DRAWINGS

FIG. 6 is a cross-sectional view sequentially illustrating steps of manufacturing the FinFET according to the first embodiment of the present invention.

FIG. 8a is a perspective view illustrating the FinFET according to a second embodiment of the present invention, and FIG. 8b is a cross-sectional view taken along line A-A' of FIG. 8a.

FIG. 13a is a cross-sectional view illustrating the fence-shaped body that has a right angle corner at an upper surface, and FIG. 13b is a cross-sectional view illustrating the fence-shaped body that has a rounded corner at the upper surface.

FIG. 14a is a cross-sectional view illustrating the fence-shaped body of which a width increases in a direction to a substrate, and FIG. 14b is a cross-sectional view illustrating the fence-shaped body of which a width is constant at the upper portion of the fence-shaped body and increases at a position lower than the upper portion in the direction to the substrate.

BEST MODE

First Embodiment

Hereinafter, a structure of a fin field effect transistor (FinFET) having leakage current and a method of manufacturing the FinFET according to a first embodiment of the present invention will be described in detail with reference to the attached drawings.

Figure 1:
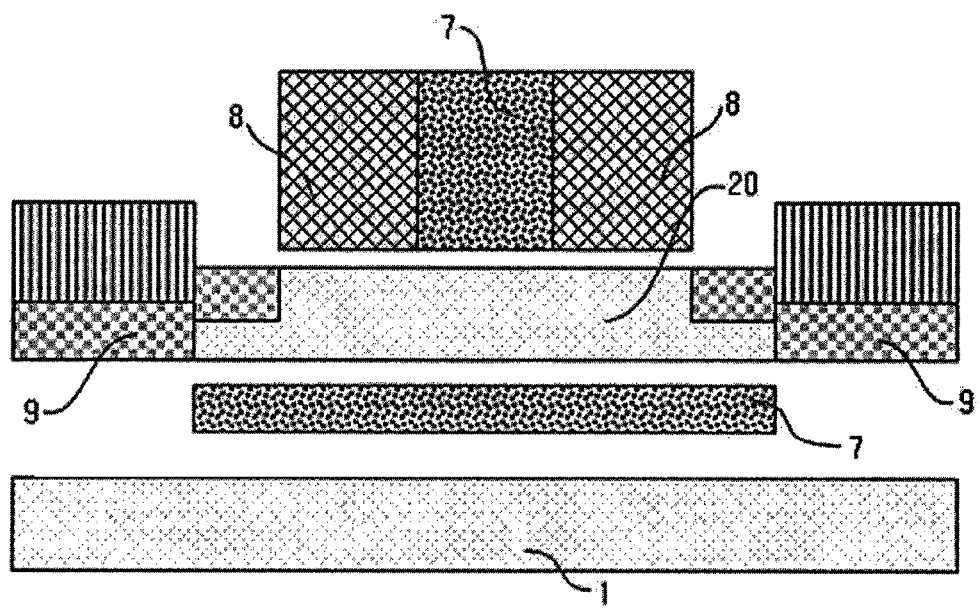
FIG. 1 is a cross-sectional view illustrating an embodiment of a silicon on insulator (SOI) double-gate device according to a related art.
Figure 2:
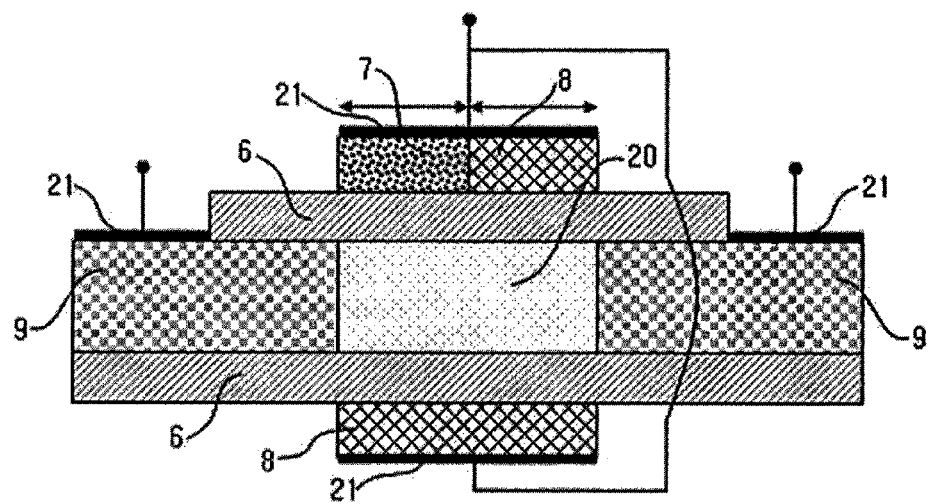
FIG. 2 is a cross-sectional view illustrating another embodiment of the SOI double-gate device according to a related art.
Figure 3:
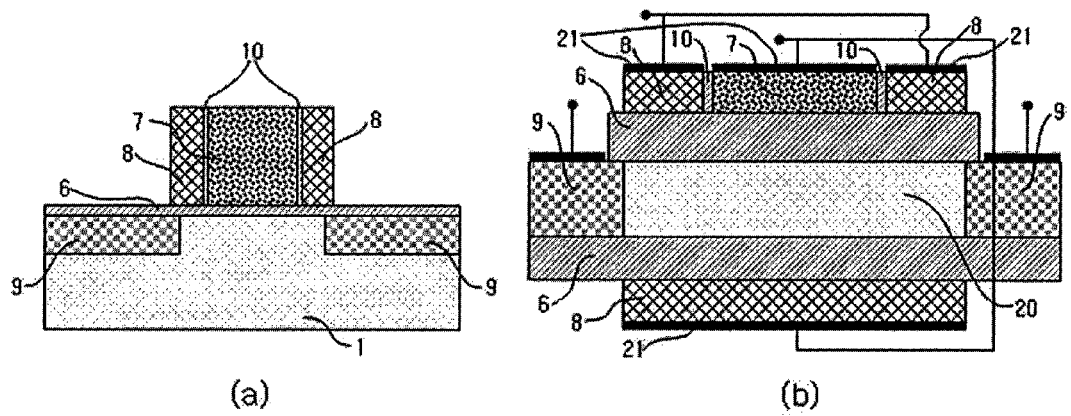
FIG. 3a is a cross-sectional view illustrating a device having a side gate implemented on a bulk substrate according to a related art.
FIG. 3b is a cross-sectional view illustrating another embodiment of the SOI double-gate device according to a related art.
Figure 4:
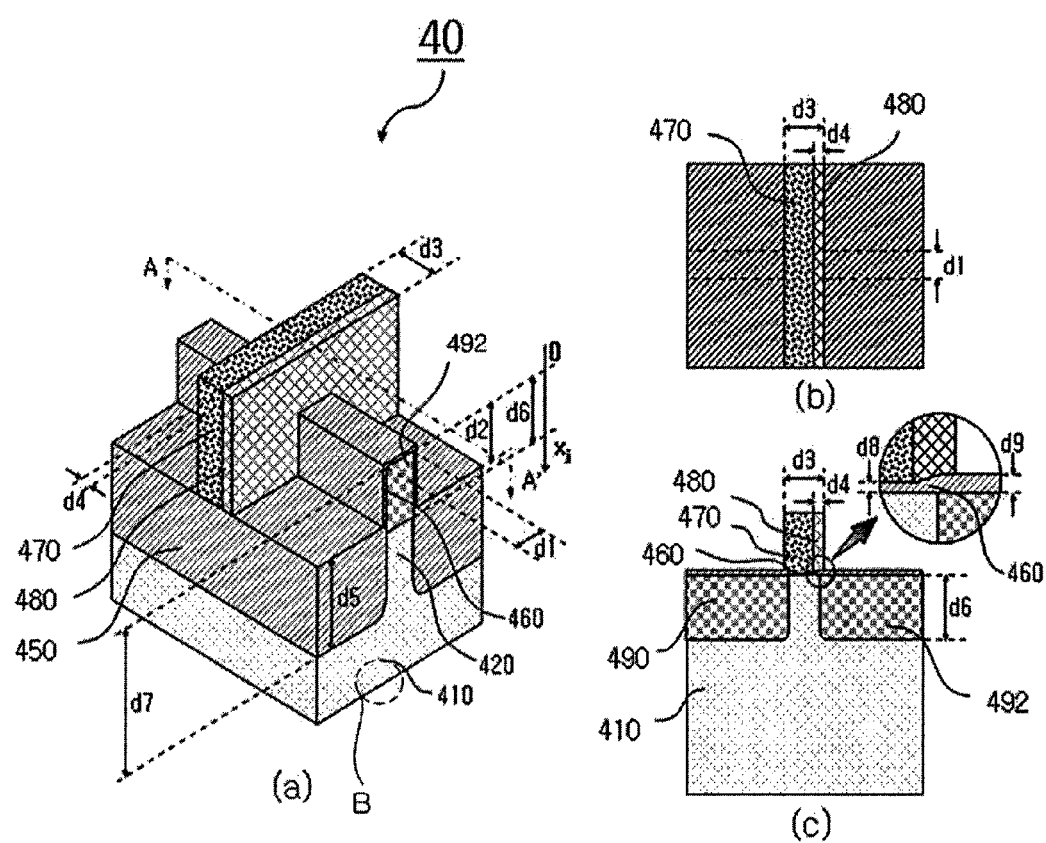
FIG. 4a is a perspective view.
FIG. 4b is a top plan view.
FIG. 4c is a cross-sectional view taken along line A-A' illustrating a fin field effect transistor (FinFET) according to a first embodiment of the present invention.

FIG. 4 is a view illustrating the FinFET having leakage current according to the first embodiment of the present invention. For the convenience of description, only main components excluding a metal layer, a contact, and an insulating layer for wiring FinFET devices are illustrated. FIG. 4a is a perspective view, FIG. 4b is a top plan view, and FIG. 4c is a cross-sectional view taken along line A-A' illustrating the FinFET according to the first embodiment of the present invention.

The FinFET 40 according to the first embodiment of the present invention includes a substrate 410, a fence-shaped body 420, a device isolating layer 450, a gate insulating layer 460, a first gate electrode 470, a second gate electrode 480, and source/drain 490 and 492.

The substrate 410 is a bulk silicon substrate.

The fence-shaped body 420 is formed on the substrate 410, and d1 denotes a width of the fence-shaped body 420 and has a value in a range of from 2 to 200 nm. In addition, d7 denotes a total height of the fence-shaped body 420 and has a value in a range of from 50 to 900 nm. In addition, d2 denotes a height of the fence-shaped body 420 from the device isolating layer 450 and has a value in a range of from 2 to 200 nm. This height becomes a height of a channel formed at a side surface of the fence-shaped body 420. In FIG. 4a, for the convenience of illustration, a corner of an upper surface of the fence-shaped body 420 has an angle of 90°. However, the corner can be formed to have an acute angle or an obtuse angle. In addition, the corner can be rounded, or the upper surface can be formed in a semicircle.

The gate insulating layer 460 is a gate oxide layer formed at side surfaces and the upper surface of the fence-shaped body 420 with a predetermined thickness. The gate insulating layer 460 formed at the side surfaces of the fence-shaped body 420 has a thickness in a range of from 0.5 to 10 nm, and the gate insulating layer 460 formed at the upper surface of the fence-shaped body 420 has a thickness in a range of from 0.5 to 200 nm. Here, the thicknesses of the gate insulating layer 460 formed at the upper surface and the side surfaces of the fence-shaped body 420 are the same, or may be different.

Particularly, in the gate insulating layer 460 formed at the upper surface of the fence-shaped body 420, the gate insulating layer 460 corresponding to an inner region of the channel has a thickness d8 in a range of from 0.5 to 200 nm, and the thickness d8 increases in directions to the source/drain so that the gate insulating layer 460 finally has a thickness d9 in a range of from 0.6 to 201 nm.

The gate electrode of the FinFET according to the first embodiment of the present invention includes the first gate electrode 470 and the second gate electrode 480 having different work functions. The first gate electrode 470 and the second gate electrode 480 are electrically connected to each other, and d3 denotes a total length of the first gate electrode and the second gate electrode.

The first gate electrode 470 is a gate electrode close to the source and made of a material having a high work function. Therefore, a threshold voltage of the FinFET device according to the present invention is mainly determined by the first gate electrode 470 having the high work function. On the other hand, the second gate electrode 480 is a gate electrode close to the drain and has a work function lower than that of the first gate electrode, and a length d4 thereof is shorter than half the length d3 of the total gate electrode and larger than 0.1 nm.

The first gate electrode 470 and the second gate electrode 480 are made of the same material and have different impurity doping types so that the second gate electrode 480 has a lower work function. Otherwise, the first gate electrode 470 and the second gate electrode 180 may be made of different materials so that the second gate electrode 480 has a lower work function. In addition, according to another embodiment of the present invention, the first gate electrode 470 and the second gate electrode 480 of the gate electrode are made of different materials and have different impurity doping types so that the second gate electrode 480 has a work function lower than that of the first gate electrode 470.

The first gate electrode 470 and the second gate electrode 480 may be made of a semiconductor material such as polycrystalline silicon, polycrystalline silicon-germanium, polycrystalline germanium, amorphous silicon, amorphous silicon-germanium, amorphous germanium, silicon, germanium, and the like, silicide with various metals, various types of metal oxide, metals having various work functions, binary metals such as tantalum nitride (TaN), titanium nitride (TiN), tungsten nitride (WN), or the like.

The device isolating layer 450 is called a device isolation oxide layer or a field oxide layer and formed at the side surfaces of the fence-shaped body 420 to electrically isolate a corresponding device from an adjacent device. A thickness of the device isolating layer 450 is denoted by d5, and the d5 ranges from 50 to 700 nm. The device isolating layer 450 according to the first embodiment of the present invention includes a first insulating layer and a second insulating layer. The first insulating layer may be a thermal oxide layer formed by performing thermal oxidation on the surface of the silicon substrate on which the fence-shaped body is formed and the surface of the fence-shaped body, and the second insulating layer may be formed by depositing an oxide layer on the thermal oxide layer.

The source/drain 490 and 492 are formed at predetermined regions of the fence-shaped body 420. More specifically, the source/drain 490 and 492 are respectively formed at both sides of the regions on which the first gate electrode 470 and the second gate electrode 480 are formed, respectively. Here, portions of the source/drain 490 and 492 and portions of the first gate electrode 470 and the second gate electrode 480 may overlap or may not overlap.

A depth d6 of the source/drain 490 and 492 is defined at the surface of the fence-shaped body in a vertical direction and ranges from 5 to 500 nm. In addition, when the portions of the source/drain 490 and 492 and the portions of the gate electrodes 470 and 480 overlap, the depth ranges from 0.1 to 30 nm.

A corner of a portion B where the fence-shaped body 420 meets the substrate 410 may be formed to be round or at a right angle.

Although not shown in FIG. 4, for wiring the FinFET device, a contact region has to be formed at each of source/drain electrodes and the gate electrode. In order to improve integrity of the device and reduce contact resistance, a size of the contact region contacting a metal layer may be similar to or larger than the width of the fence-shaped body 420. When the contact is larger, the contact may be formed on portions of the upper surface and the side surface of the fence-shaped body 420 on which the source/drain is formed.

A width of the fence-shaped body on which the source/drain is formed may be larger than that of the fence-shaped body on which the channel is formed adjacent to the first and second gates to reduce resistance of the source/drain. The work function of the second gate electrode 480 of the FinFET device according to the present invention is low, so that an electric field in the drain region overlapping with the second gate electrode in a direction from the gate to the fence-shaped body can be reduced. In addition a horizontal electric field due to drain bias can be reduced. As a result, an object of the present invention that is to reduce gate-induced drain leakage (GIDL) can be achieved. In addition, the electric field due to a drain voltage can be reduced, so that hot-carrier generation can be suppressed. Therefore, durability of the device can be improved.

FIG. 4c is a cross-sectional view taken along line A-A' illustrated in FIG. 4a. In FIG. 4c, a thickness profile of the gate insulating layer 460 is illustrated. At the region where the second gate electrode 480 and the drain region 492 overlap, the thickness d9 of the gate insulating layer 460 increases in the direction from the channel to the drain region 492 so as to reduce GIDL. Here, the thickness d8 of the gate insulating layer 460 in the channel region ranges from 0.5 to 200 nm, and the thickness d9 of the gate insulating layer at the region where the second gate and the drain overlap ranges from 0.6 to 201 nm. According to another embodiment of the present invention, a thickness of the fence-shaped body on which the channel is formed may be smaller than that of the fence-shaped body on which the source/drain are formed.

Figure 5:
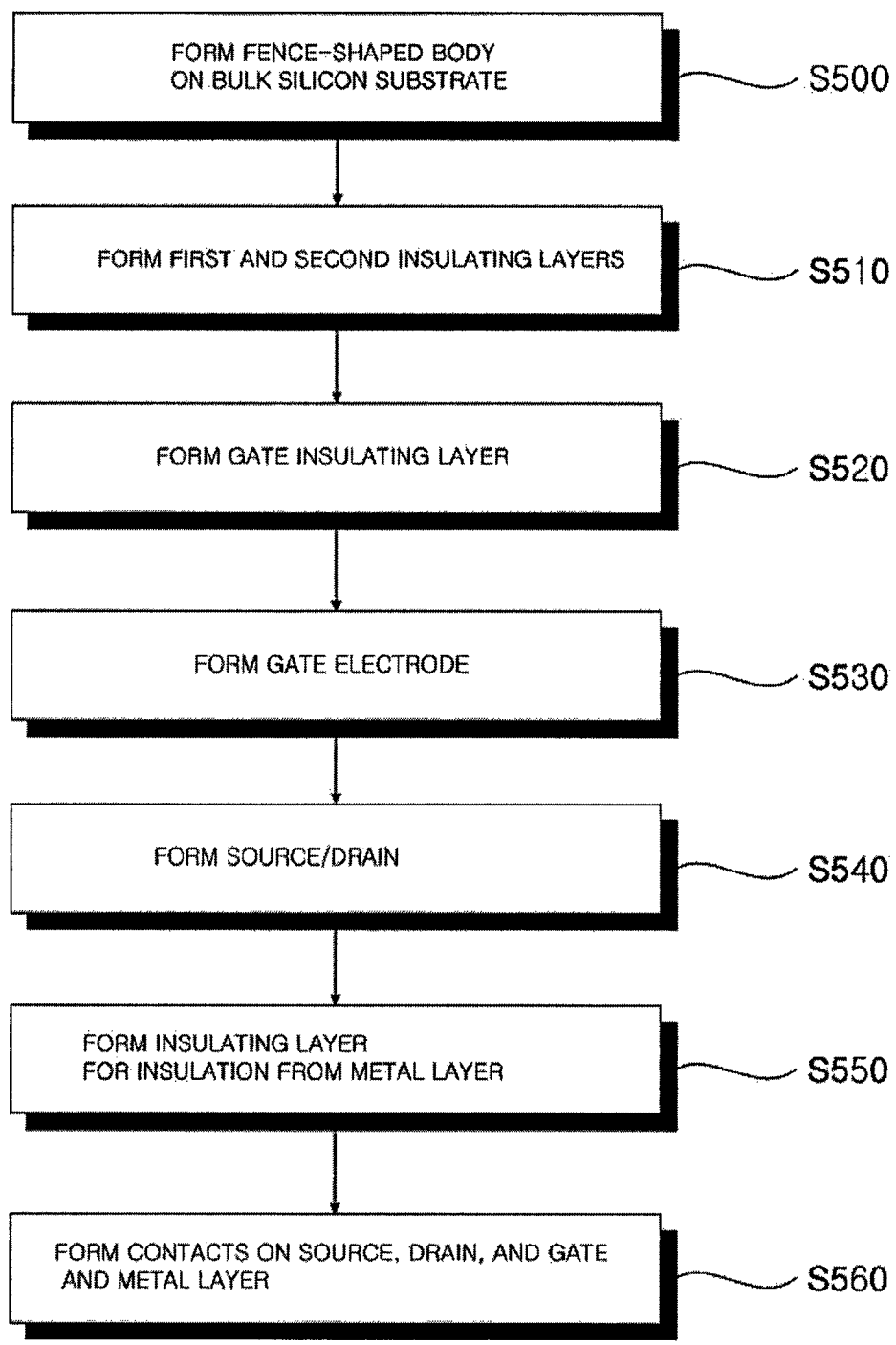
FIG. 5 is a flowchart of a method of manufacturing the FinFET according to the first embodiment of the present invention.

Hereinafter, a method of manufacturing the FinFET having low leakage current with the aforementioned construction will be described in detail with reference to FIGS. 5 and 6. Referring to FIG. 5, the method of manufacturing the FinFET according to the present invention includes: a step of forming the fence-shaped body 420 on the bulk silicon substrate 410 by using monocrystalline silicon (step 500); a step of forming the first insulating layer and the second insulating layer on a surface of the bulk silicon substrate to a predetermined height of the fence-shaped body (step 510); a step of forming the gate insulating layer at the side surfaces and the upper surface of the fence-shaped body protruding from the first and second insulating layers (step 520); a step of forming a gate on the first and second insulating layers and the gate insulating layer as a gate electrode made of a gate material having a high work function and a gate material having a low work function (step 530); a step of forming the source/drain regions on the fence-shaped body excluding a portion of the fence-shaped body covered by the gate electrode (step 540); a step of forming the insulating layer for electrically isolating the first and second insulating layers, the gate insulating layer, and the gate electrode from a metal layer thereon (step 550); and a step of forming contacts at the source, the drain, and the gate and forming a metal layer for wiring (step 560). Next steps are similar to those in a conventional manufacturing method. Now, each step will be described in detail.

FIG. 6a is a cross-sectional view illustrating an intermediate state formed in the step (step 500) of forming the fence-shaped body 420 on the bulk silicon substrate 410. The fence-shaped body forming step (step 500) includes: a step of forming an insulating layer (for example, an oxide layer, a nitride layer, or an oxide layer and a nitride layer) that is to be used as a hard mask material on the silicon substrate (step 502); a step of forming an active mask for defining the fence-shaped body by patterning the hard disk insulating layer (step 503); a step of etching the silicon substrate by using the active mask to form the fence-shaped body (step 504); a step of performing oxide layer growth or removal one or more times or performing hydrogen-annealing in order to improve a surface of the fence-shaped body, control a width of the fence-shaped body, and round an upper corner of the fence-shaped body (step 505); and a step of annealing in a gas atmosphere such as hydrogen atmosphere in order to improve the surface of the fence-shaped body (step 506).

FIG. 6b is a cross-sectional view illustrating an intermediate state in which the device isolating layer is formed on the surface of the bulk silicon substrate 410 to a first height of the fence-shaped body 420 in the step 510. The device isolating layer includes the first insulating layer 431 and the second insulating layer 450. The device isolating layer forming step (step 510) includes: a step of forming the first insulating layer 431 by performing thermal oxidation on the surfaces of the fence-shaped body and the silicon substrate (step 511); a step of depositing and forming the second insulating layer 450 on the first insulating layer (step 512); a step of performing planarization on the second insulating layer at a height adjacent to the surface of the fence-shaped body (step 513); and a step of etching the first and second insulating layers to the first height of the fence-shaped body (step 514). Here, the first height indicates an upper surface of the second insulating layer 450.

FIG. 6c illustrates a cross-section of the fence-shaped body taken along the first gate electrode after the gate insulating layer 460 and the gate electrode 470 are formed on the side surfaces and the upper portion of the fence-shaped body protruding from the first insulating layer in the steps 520 and 530. The gate insulating layer forming step (step 520) includes: a step of performing annealing in a state where the upper surface and the side surfaces of the fence-shaped body are exposed from the upper surface of the fence-shaped body to a predetermined depth in order to improve surface characteristics of the fence-shaped body (step 521); and a step of forming the gate insulating layer on the exposed upper surface and side surfaces of the fence-shaped body with substantially the same thickness (step 522).

According to another embodiment of the present invention, the gate insulating layer forming step (step 520) in the manufacturing method includes: a step of forming the fence-shaped body so that the fence-shaped body is parallel with or perpendicular to a flat zone or a notch of the silicon wafer that is the substrate (step 525); a step of sequentially forming the first and second insulating layers to a predetermined height of the fence-shaped body or forming the first insulating layer and a nitride layer to a predetermined height of the fence-shaped body and forming the second insulating layer to a height adjacent to the surface of the fence-shaped body (step 527); a step of performing annealing in a state where the upper surface and the side surfaces of the fence-shaped body are exposed to a predetermined depth from the upper surface of the fence-shaped body in order to improve the surface characteristics of the silicon body (step 528); and a step of growing the oxide layer on the exposed upper surface and side surfaces of the fence-shaped body in consideration of directionality of crystallization so that the thickness of the oxide layer increases in a direction to the side surface (step 529). In this case, the thickness of the gate insulating layer formed on the upper surface of the fence-shaped body is smaller than that of the gate insulating layer formed on the side surfaces of the fence-shaped body.

According to another embodiment of the present invention, the gate insulating layer forming step (step 520) in the manufacturing method includes: a step of remaining the oxide layer that is the hard mask material initially formed on the silicon surface to form the fence-shaped body in the upper portion of the fence-shaped body; a step of sequentially forming the first insulating layer, the nitride layer, and the second insulating layer and performing planarization at a position adjacent to a surface of the nitride layer formed at the upper surface of the fence-shaped body; a step of selectively etching the nitride layer to a predetermined depth from the upper portion of the fence-shaped body; a step of etching the first insulating layer at the exposed side surface to expose the side surface of the fence-shaped body; a step of performing annealing in a state where the side surface of the fence-shaped body is exposed in order to improve surface characteristics of the silicon body; and a step of growing the gate insulating layer on the exposed upper surface and side surfaces of the fence-shaped body. In this case, the gate insulating layer is formed to be thinner than the insulating layer remaining at the upper surface of the fence-shaped body.

Figure 7:
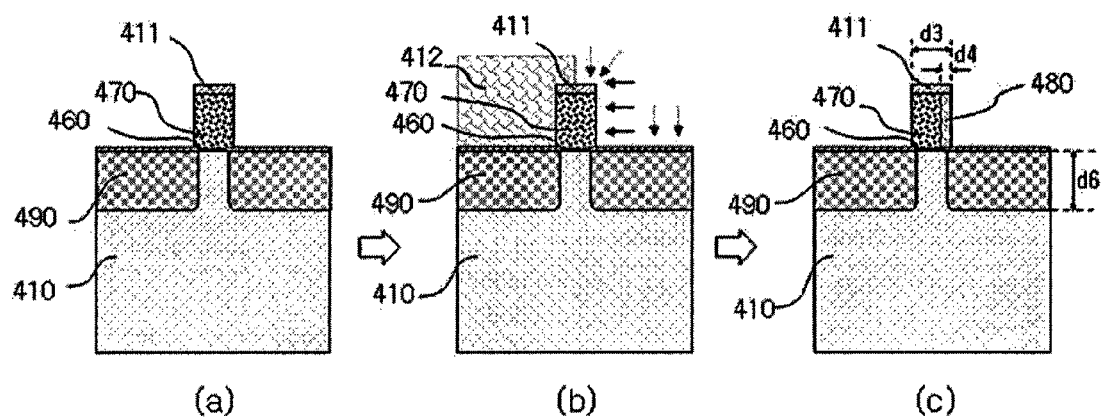
FIG. 7 is a cross-sectional view sequentially illustrating steps of forming a gate electrode of the FinFET according to the first embodiment of the present invention.

FIG. 6d is a perspective view illustrating an intermediate state taken in the direction of the channel length along the fence-shaped body after the gate electrodes 470 and 480, the source 490, and the drain 492 are formed in the steps 530 and 540. FIG. 7 is a cross-sectional view sequentially illustrating steps of forming the gate electrode including the first gate electrode 470 having a high work function and the second gate electrode 480 having a low work function of the FinFET according to an exemplary embodiment of the present invention. Now, the steps of forming the gate electrode are sequentially described with reference to FIG. 7.

First, as illustrated in FIG. 7a, a polycrystalline silicon layer is formed to form the gate electrode after the gate insulating layer 460 is formed, the polycrystalline silicon layer is doped with $p^+$ having a high density for n-channel metal-oxide semiconductor (NMOS) cell device, an insulating layer 411 having a predetermined thickness is formed on the polycrystalline silicon layer, photolithography is performed to etch the insulating layer and the polycrystalline silicon layer to form the gate electrode 470.

Next, as illustrated in FIG. 7b, a photoresist layer is formed on the entire surface and patterned, the photoresist layer is removed in a direction of the drain region, and the active region that is to be the source is covered by the photoresist 412 on the basis of the center of the insulating layer formed on the polycrystalline silicon layer. Next, with the photoresist 412 as a mask, a side surface of the exposed $p^+$ polycrystalline silicon layer is counter-doped with $n^+$ by using a plasma doping method or tilt ion implantation to form the second gate electrode 480.

Next, as illustrated in FIG. 7c, the photoresist 412 is removed, so that the gate electrode having the first gate electrode 470 having a high work function and the second gate electrode 480 having a low work function is completed.

According to another embodiment, the gate electrode forming step (step 530) includes: a step of forming a polycrystalline silicon layer to form the gate electrode after forming the gate insulating layer, doping the polycrystalline silicon layer with $p^+$ having a high density for the NMOS cell device, forming the insulating layer 411 having a predetermined thickness on the polycrystalline silicon layer, and performing photolithography to etch the insulating layer and the polycrystalline silicon layer to form the gate electrode 470; a step of depositing a nitride layer with a small thickness and performing anisotropic etching thereon to cover a side surface of the polycrystalline silicon layer exposed in a spacer shape; a step of growing an oxide layer with a predetermined thickness on the source/drain regions; a step of exposing the side surface of the $p^+$ polycrystalline silicon layer by removing the nitride layer spacer; a step of covering the source region by using the photoresist on the basis of the center of the insulating layer formed on the polycrystalline silicon layer; and a step of performing counter-doping on the exposed side surface of the $p^+$ polycrystalline silicon layer with $n^+$ by using the plasma doping method or tilt ion implantation.

In the aforementioned steps, a next step may be performed without using the photoresist that covers the source region on the basis of the center of the insulating layer formed on the polycrystalline silicon layer. In this case, both side surfaces of the etched gate electrode are counter-doped with n+. As a result, in the FinFET according to the present invention, the n+ polycrystalline silicon layer that functions as the second gate electrode is formed at both side surfaces of the p+ polycrystalline silicon layer that functions as the first gate electrode.

In FIG. 6d, the source/drain forming step (step 540) includes: a step of performing ion implantation or plasma doping to form a lightly doped drain (LDD) after the gate electrode is formed, or forming an insulating layer with a predetermined thickness as a spacer after the gate electrode is formed and performing ion implantation or plasma doping to form the LDD (step 542); a step of forming the spacer by using the insulating layer (step 543); and a step of performing ion implantation or plasma doping for an $n^+$ heavily doped drain (HDD) for the NMOS cell device (step 544).

According to another embodiment, the source/drain forming step (step 540) includes a step of performing ion implantation or plasma doping for HDD without LDD after the gate electrode is formed, or a step of forming a spacer by using an insulating material after the gate electrode is formed and performing ion implantation or plasma doping for the HDD without the LDD.

According to another embodiment of the present invention, the method of manufacturing the FinFET is a method of forming the gate electrode by using a damascene process or a reverse gate process.

A step of forming the gate electrode using the damascene process includes: a step of forming a fence-shaped body made of monocrystalline silicon on a bulk silicon substrate; a step of forming a first insulating layer and a second insulating layer on a surface of the bulk silicon substrate to a height adjacent to an upper surface of the fence-shaped body; a step of forming a third insulating layer on the surface of the fence-shaped body; a step of forming a fourth insulating layer or a semiconductor layer having selective etching property on the third insulating layer; a step of forming a photoresist pattern on a wafer by using a mask for opening a gate; a step of sequentially etching the fourth insulating layer or the semiconductor layer and the third insulating layer; a step of vertically etching the first and second insulating layers to a predetermined depth from the surface of the body; a step of removing the remaining photoresist; a step of growing a sacrificial oxide layer on the exposed surface and a portion of side surfaces of the fence-shaped body; a step of performing channel ion implantation and annealing; a step of removing the sacrificial oxide layer and performing annealing to improve surface characteristics; a step of forming a gate insulating layer; a step of depositing and performing planarization on the polycrystalline silicon layer for the gate electrode to remain the polycrystalline silicon gate electrode only in a notch defined and etched by a gate electrode mask; a step of doping the gate electrode with p$^+$ and performing annealing; a step of removing the fourth insulating layer and the semiconductor layer; a step of etching the first and second insulating layers to a predetermined depth from the surface of the fence-shaped body to expose a side surface of the gate electrode; a step of counter-doping only a side wall of the gate electrode in a direction of a drain with n$^+$ by performing plasma doping or ion implantation; a step of forming source/drain regions at a remaining region of the fence-shaped body excluding a region covered by the gate electrode; a step of forming an insulating layer for electrically isolating the first and second insulating layers, the gate insulating layer, and the gate electrode from a metal layer formed thereon; and a step of forming contacts on the source, the drain, and the gate and forming a metal layer for wiring.

MODE FOR INVENTION

Second Embodiment

Figure 8:
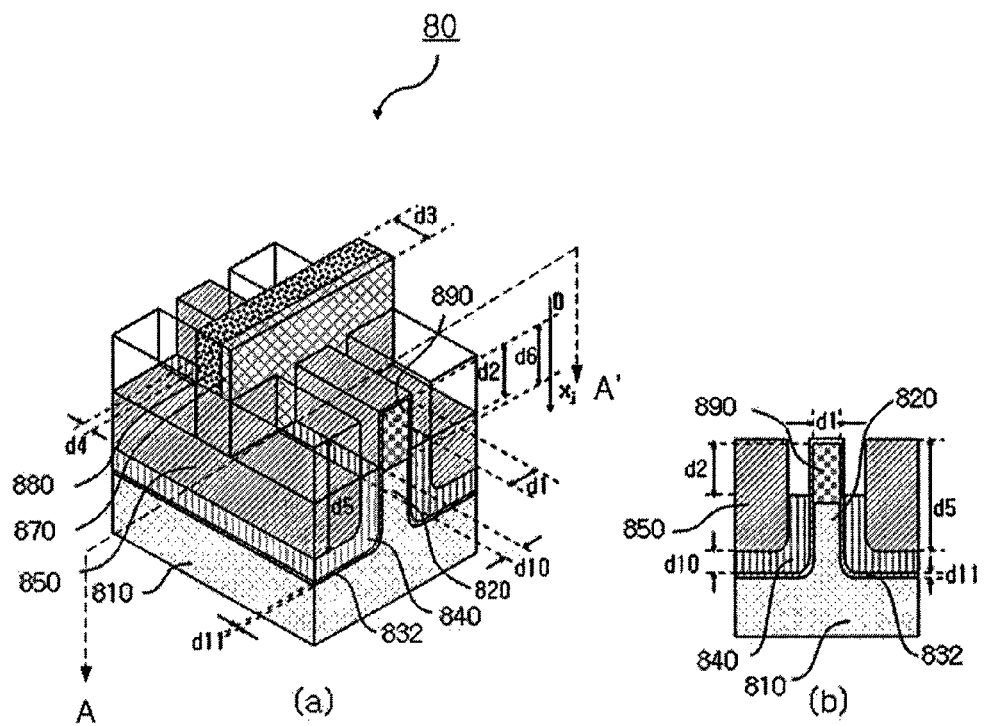

Hereinafter, a FinFET having low leakage current according to a second embodiment of the present invention will be described in detail. FIG. 8a is a perspective view illustrating the FinFET according to the second embodiment of the present invention, and FIG. 8b is a cross-sectional view taken along line A-A' of FIG. 8a. Referring to FIG. 8, the FinFET according to the second embodiment includes a substrate 810, a fence-shaped body 820, a gate insulating layer 830, a first insulating layer 832, a nitride layer 840, a second insulating layer 850, a first gate electrode 870, a second gate electrode 880, and source/drain regions 890 and 892. A description of components of the FinFET according to the second embodiment that are the same as those according to the first embodiment is omitted for the convenience of description.

The second insulating layer 850 is a device isolating layer for electrically isolating a corresponding device from an adjacent device and is also called a field oxide layer. Planarization is performed on the second insulating layer 850 and the nitride layer 840 at a height adjacent to a surface of the body, the nitride layer is selectively etched to a predetermined depth d2 to expose an upper side wall of the fence-shaped body 820. In this case, a thickness d5 of the second insulating layer 850 may be greater than that illustrated in FIG. 4 to reduce parasitic capacitance. The nitride layer 840 is removed to a depth in a range of from 2 to 200 nm in the vertical direction from the upper surface of the fence-shaped body 820 to apparently expose the upper side wall of the fence-shaped body 820. A thickness d10 of the nitride layer 840 may range from 2 to 200 nm.

Figure 9:
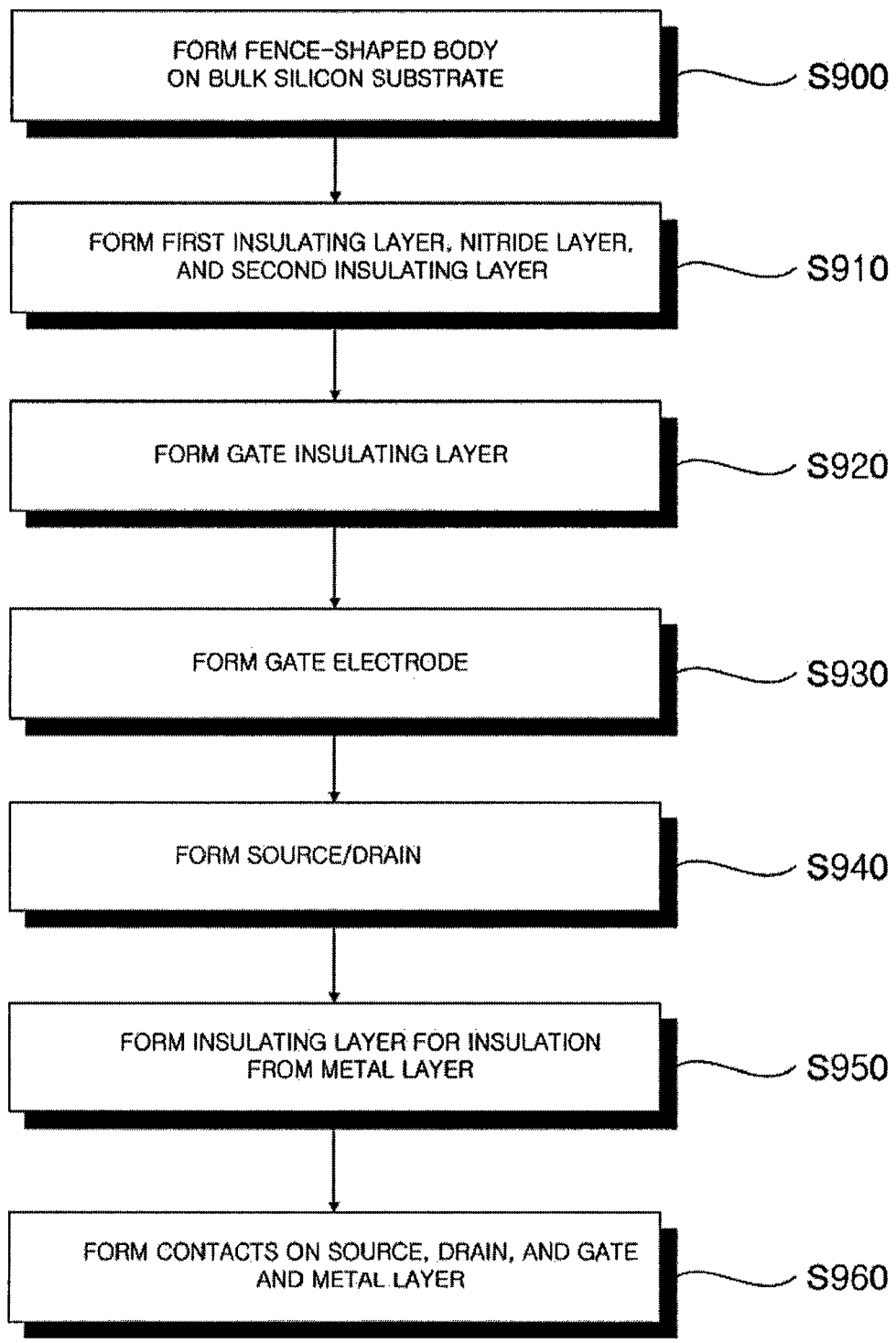
FIG. 9 is a flowchart of a method of manufacturing the FinFET according to the second embodiment of the present invention.

Hereinafter, a method of manufacturing the aforementioned FinFET according to the second embodiment will be described with reference to FIG. 9. The method of manufacturing the FinFET according to the second embodiment includes: a step of forming the fence-shaped body made of monocrystalline silicon on a bulk silicon substrate (step 900); a step of forming the first insulating layer, the nitride layer, and the second insulating layer from a surface of the bulk silicon substrate to a height adjacent to the upper surface of the fence-shaped body, selectively etching the nitride layer to a depth d2, and removing the first insulating layer at the side wall of the fence-shaped body (step 910); a step of forming the gate insulating layer on the side surfaces and the upper surface of the fence-shaped body protruding from the first insulating layer (step 920); a step of forming a gate electrode made of a gate material having a high work function and a gate material having a low work function on the first and second insulating layers, the nitride layer, and the gate insulating layer (step 930); a step of forming the source/drain regions on a remaining region of the fence-shaped body excluding a region covered by the gate electrode (step 940); a step of forming an insulating layer for electrically isolating the first and second insulating layers, the gate insulating layer, and the gate electrode from a metal layer formed thereon (step 950); and a step of forming contacts on the source, the drain, and the gate electrodes and forming a metal layer for wiring (step 960).

In the aforementioned steps, the step of forming the first insulating layer, the nitride layer, and the second insulating layer (step 910) includes: a step of forming the first insulating layer by performing thermal oxidation on the surfaces of the silicon substrate and the fence-shaped body; a step of sequentially forming the nitride layer and the second insulating layer; a step of performing planarization on the second insulating layer at a height adjacent to the surfaces of the first insulating layer and the nitride layer formed on the upper surface of the fence-shaped body over the entire surface of the wafer; a step of selectively etching the nitride layer to a predetermined depth from the upper surface of the fence-shaped body; and a step of etching the first insulating layer exposed to the surface and the side surfaces of the fence-shaped body.

According to the second embodiment of the present invention, all geometries of the components and conditions of the steps excluding those associated with the nitride layer 840 are the same as in the first embodiment. In addition, the damascene gate step described according to the first embodiment may be similarly applied to form a device of the structure according to the second embodiment.

Third Embodiment

Hereinafter, a structure of a FinFET having low leakage current according to a third embodiment of the present invention will be described in detail with reference to FIG. 10. Components of the FinFET according to the current embodiment excluding a gate electrode are the same as those according to the first embodiment, so that a detailed description thereof is omitted.

Figure 10:
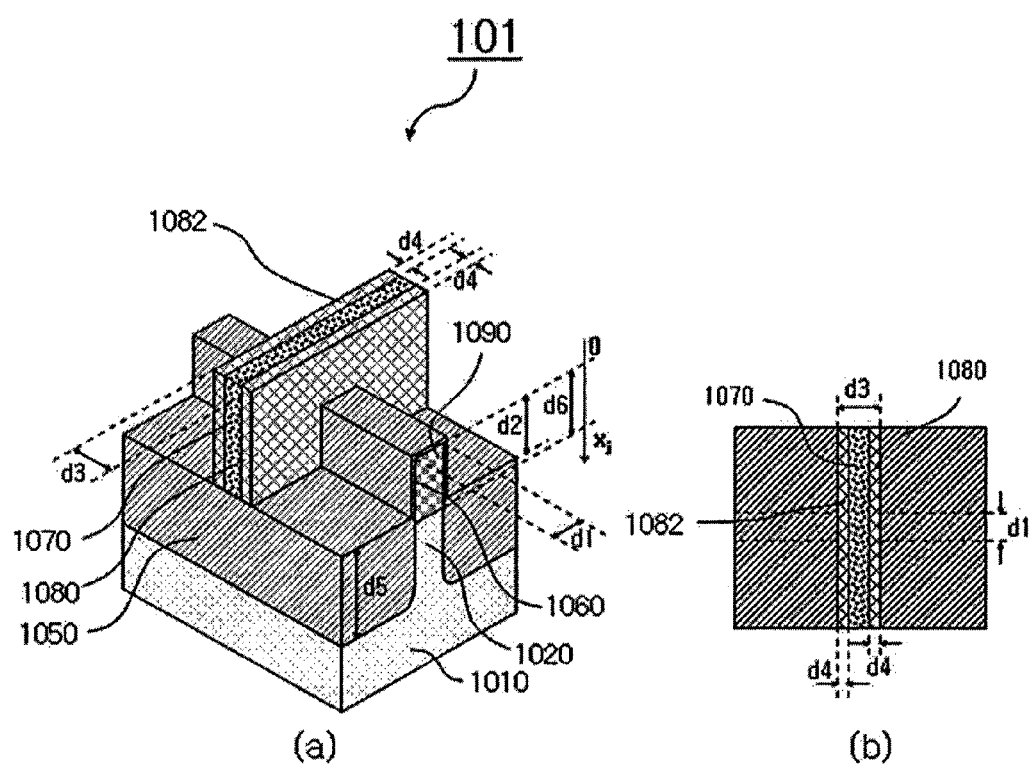
FIG. 10a is a perspective view and FIG. 10b is a top plan view illustrating a FinFET according to a third embodiment of the present invention.

FIG. 10a is a perspective view and FIG. 10b is a top plan view illustrating the FinFET 101 according to the third embodiment of the present invention. Referring to FIG. 10, the FinFET according to the third embodiment of the present invention includes second gate electrodes 1080 and 1082 having low work functions disposed at both side surfaces of a first gate electrode 1070 having a high work function. In the aforementioned structure of the gate electrode, a drain region and a source region overlap with the second gate electrodes 1080 and 1082 having low work functions. Accordingly, GIDL can be reduced. However, a threshold voltage of a device may be decreased.

The aforementioned structure of the gate electrode according to the third embodiment of the present invention may be applied to the FinFETs according to the first and second embodiments.

Fourth Embodiment

Hereinafter, a structure of a FinFET 111 having low leakage current according to a fourth embodiment of the present invention will be described in detail with reference to FIG. 11. Components of the FinFET according to the current embodiment excluding a gate electrode are the same as those according to the first embodiment, so that a detailed description thereof is omitted.

Figure 11:
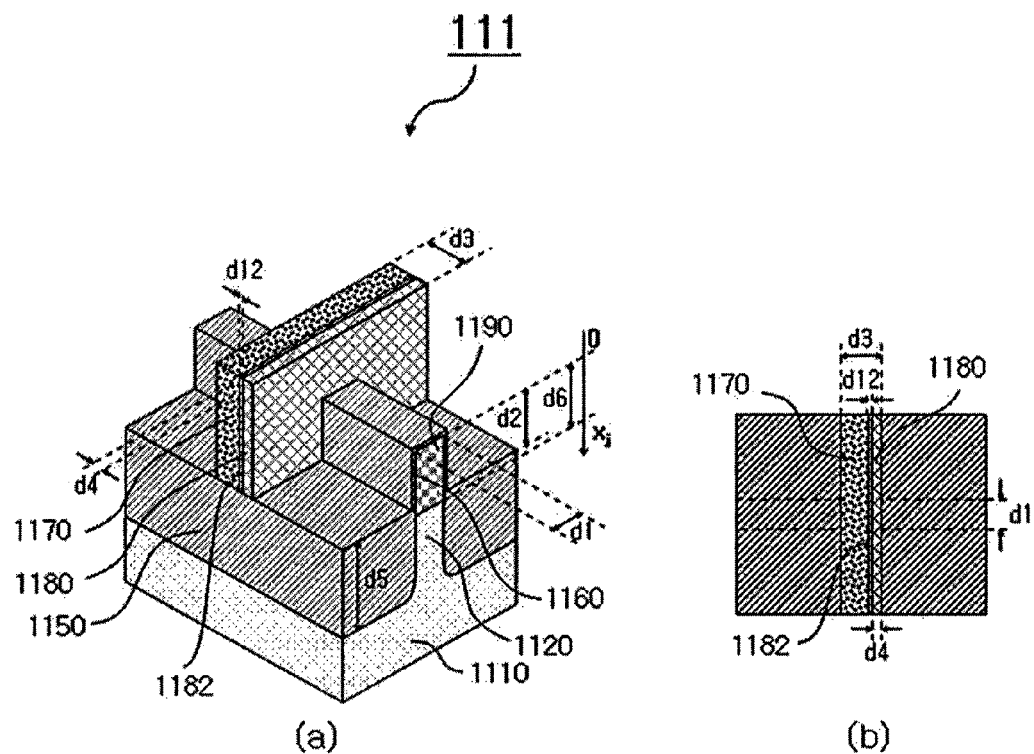
FIG. 11a is a perspective view and FIG. 11b is a top plan view illustrating a FinFET according to a fourth embodiment of the present invention.

FIG. 11a is a perspective view and FIG. 11b is a top plan view illustrating the FinFET according to the fourth embodiment of the present invention. Referring to FIG. 11, the FinFET according to the fourth embodiment of the present invention further includes an isolation insulating layer 1182 for electric isolation provided between a first gate electrode 1170 having a high work function and a second gate electrode 1180 having a low work function. A thickness d12 of the added isolation insulating layer 1182 ranges from 0.5 to 10 nm.

The structure of the gate electrode according to the fourth embodiment of the present invention may be applied to the FinFETs according to the first and second embodiments.

Fifth Embodiment

Hereinafter, a structure of a FinFET 121 having low leakage current according to a fifth embodiment of the present invention will be described in detail with reference to FIG. 12.

Figure 12:
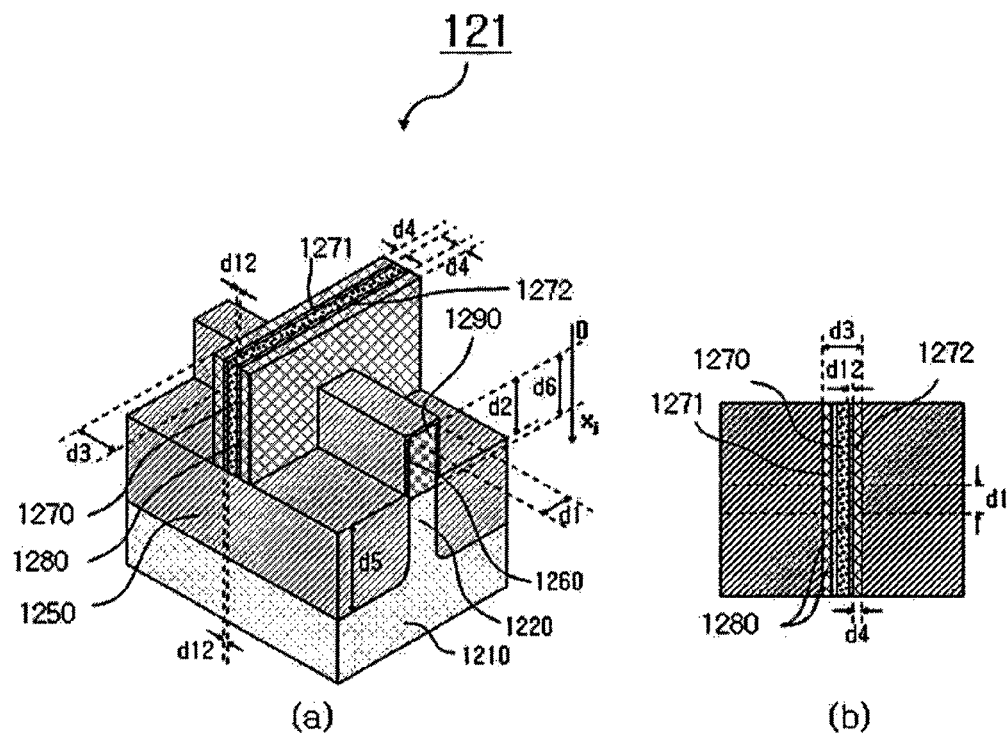
FIG. 12a is a perspective view and FIG. 12b is a top plan view illustrating a FinFET according to a fifth embodiment of the present invention.

FIG. 12a is a perspective view and FIG. 12b is a top plan view illustrating the FinFET according to the fifth embodiment of the present invention. Referring to FIG. 12, the FinFET according to the fifth embodiment of the present invention includes a first gate electrode 1270 having a high work function, first and second isolation insulating layers 1271 and 1272 formed at both side surfaces of the first gate electrode 1270, respectively, and second gate electrodes 1280 formed at the both side surfaces of the first gate electrode interposing the first and second isolation insulating layers 1271 and 1272. The second gate electrodes 1280 are made of a material having a work function lower than that of the first gate electrode 1270.

A thickness d12 of the first and second insulating layers 1271 and 1272 ranges from 0.5 to 10 nm.

Various Embodiments of Structure of Fence-Shaped Body

Hereinafter, the structures of the fence-shaped bodies 420, 920, 1020, 1120, and 1220 according to the first to fifth embodiments of the present invention will be described in detail.

Figure 13:
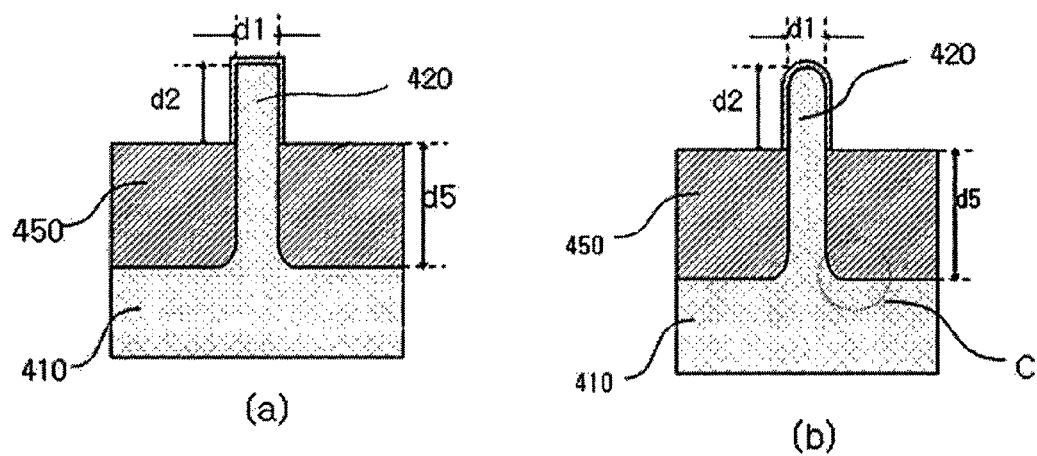
FIG. 13 illustrates embodiments of an upper portion of a fence-shaped body of the FinFET according to the present invention.

FIG. 13 illustrates embodiments of the structure the upper portion of the fence-shaped body according to the present invention. FIG. 13a illustrates the fence-shaped body that has a right angle corner at the upper surface thereof, and FIG. 13b illustrates the fence-shaped body that has a rounded corner at the upper surface thereof. It is preferable that the fence-shaped body has the rounded corner at the upper surface, and in this case, concentration of an electric field from the gate electrode can be prevented and durability of the device can be improved.

A main body of the fence-shaped body 420 is perpendicular to the substrate 410, and a portion C where the substrate 410 and the fence-shaped body 420 meet is rounded.

Figure 14:
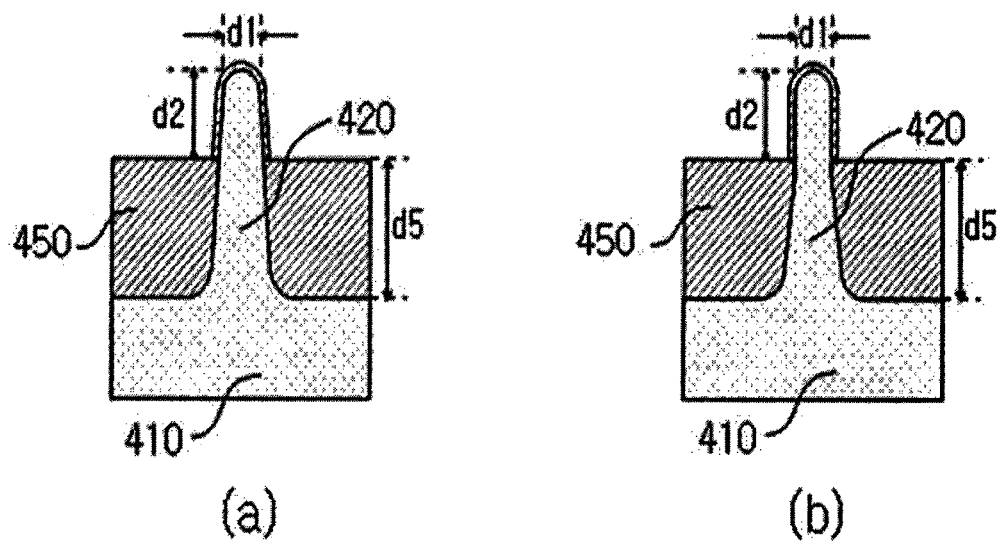
FIG. 14 illustrates embodiments of a lower portion of the fence-shaped body of the FinFET according to the present invention.
Figure 15:
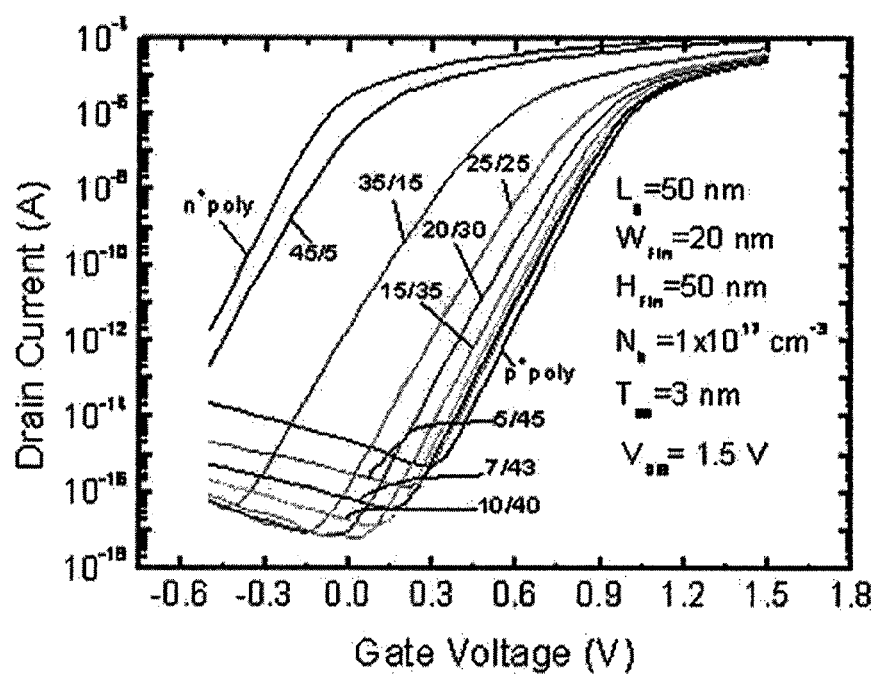
FIG. 15 is a graph illustrating $I_D$-$V_{GS}$ characteristics of an $n^+/p^+$ polycrystalline gate having a fixed length of 50 nm according to changes in a length of an $n^+$ polycrystalline silicon in the FinFET according to the present invention.
Figure 16:
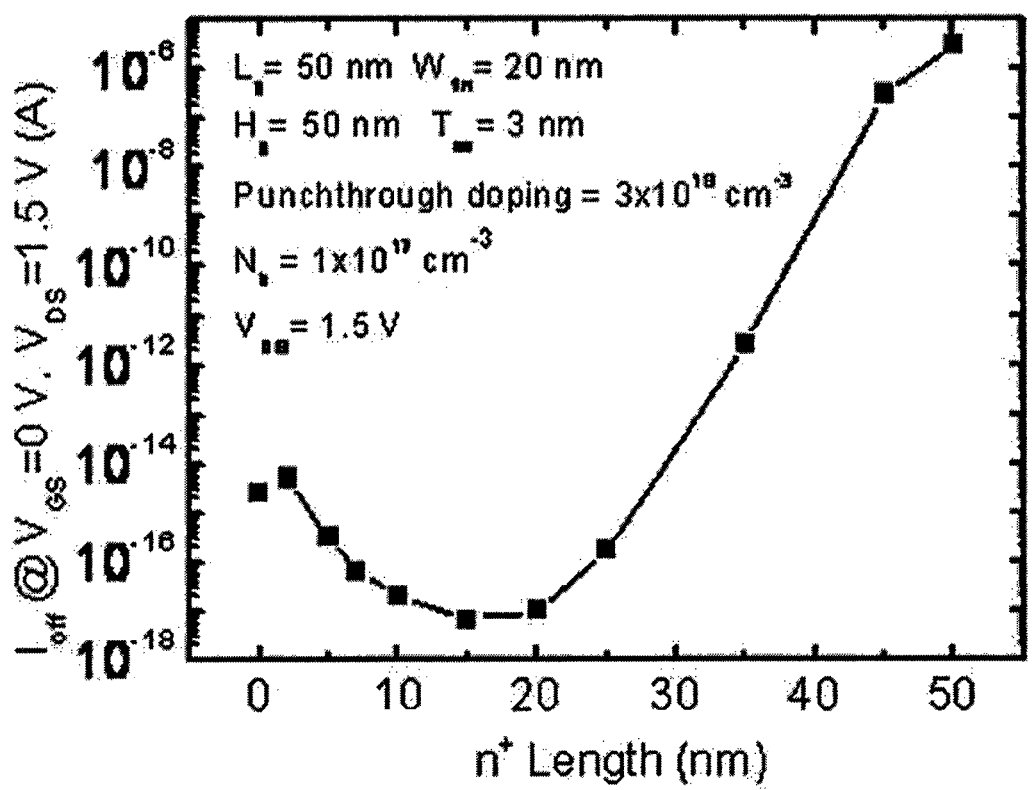
FIG. 16 is a graph illustrating gate induced drain leakage (GIDL) characteristics of the $n^+/p^+$ polycrystalline gate having a fixed length of 50 nm according to changes in a length of the $n^+$ polycrystalline silicon in the FinFET according to the present invention.

FIG. 14 is a cross-sectional view illustrating embodiments of the structure of the lower portion of the fence-shaped body according to the present invention. As illustrated in FIG. 13b, basically, a thickness from the surface of the fence-shaped body to the substrate is constant. FIG. 14a illustrates the fence-shaped body of which a width at the upper surface d1 uniformly increases so as to be a width at the lower surface. FIG. 14b illustrates the fence-shaped body of which a width from the upper surface d1 to the surface d1 of the device isolating layer is constant, and the width at the surface of the device isolating layer uniformly increases so as to be a width at the lower surface.

As illustrated in FIG. 14a, a profile of the width of the fence-shaped body that increases in a direction from the upper portion of the body to the substrate 410 can be generated by performing general steps, and in this case, resistance of the fence-shaped body connected to the substrate 410 can be reduced.

The channel of the FinFET according to the present invention has a depth d2 from the upper surface of the body to the surface of the device isolating layer. As illustrated in FIG. 14a, the width of the fence-shaped body increases in the range of the depth d2 from the surface of the fence-shaped body, so that a threshold voltage also increases.

As illustrated in FIG. 14b, the width d1 of the fence-shaped body at the region where the channel is formed is constant in the range of the depth d2, and the width of the fence-shaped body increases in the direction to the substrate 410 below the region. In this case, the channel of the device is formed at the fence-shaped body having the constant width, so that the threshold voltage of the device can be constant.

While the present invention has been particularly shown and described with reference to exemplary embodiments thereof, it will be understood by those skilled in the art that various changes in form and details may be made therein without departing from the spirit and scope of the present invention as defined by the appended claims.

INDUSTRIAL APPLICABILITY

The fin field effect transistor (FinFET) according to the present invention can be widely used as a dynamic random access memory (DRAM) cell device.

The invention claimed is:

1. A FinFET (fin field effect transistor) having low leakage current comprising:
   a bulk silicon substrate;
   a fence-shaped body which is formed by patterning the substrate and has a shape of a fence having predetermined height, width, and length;
   an insulating layer which is made of an insulating material and is formed on a surface of the substrate to a first height of the fence-shaped body;
   a gate insulating layer formed at side walls and an upper surface of the fence-shaped body protruding from the insulating layer;

a gate electrode formed on the gate insulating layer and the insulating layer to be perpendicular to a direction of the length of the fence-shaped body; and source/drain formed at regions of the fence-shaped body where the gate electrode is not formed, wherein the gate electrode includes a first gate electrode and a second gate electrode electrically connected to the first gate electrode, the second gate electrode has a work function lower than that of the first gate electrode, and the second gate electrode is formed at a side surface of the first gate electrode to be close to the drain.

2. The FinFET of claim 1, wherein the insulating layer comprises:
a thermal oxide layer formed on the substrate and the side surfaces of the fence-shaped body; and
a device isolating layer deposited on the thermal oxide layer to electrically isolate a corresponding device from an adjacent device.

3. The FinFET of claim 1, wherein the insulating layer comprises:
a thermal oxide layer formed on the substrate and the side surfaces of the fence-shaped body;
a nitride layer formed on the thermal oxide layer; and
a field insulating layer deposited on an upper portion of the nitride layer to electrically isolate a corresponding device from an adjacent device.

4. The FinFET of claim 1, wherein the fence-shaped body has a rounded corner at the upper surface of the fence-shaped body.

5. The FinFET of claim 1, wherein the width of the fence-shaped body from the surface of the fence-shaped body to the substrate is constant, the width of the fence-shaped body increases in a direction from the upper surface of the fence-shaped body to the substrate, or the width of the fence-shaped body is constant to the first height from the upper surface and increases in a direction from the first height to the substrate.

6. The FinFET of claim 1, wherein a thickness of the gate insulating layer formed on the side surfaces and the upper portion of the fence-shaped body ranges from 0.5 to 200 nm at an internal channel, and the thickness of the gate insulating layer increases in directions to the source/drain so as to range 0.6 to 201 nm.

7. The FinFET of claim 1, wherein a size of a contact region for contacting a metal layer is similar to or larger than the width of the fence-shaped body, and when the size of the contact region is larger than the width of the fence-shaped body, the contacts are formed at portions of the surface and the side surfaces of the fence-shaped body on which the source/drain are formed.

8. The FinFET of claim 1, wherein the first gate electrode and the second gate electrode are made of the same material and have different impurity doping types, made of different materials, or made of different materials and have different impurity doping types in order to have different work functions.

9. A FinFET having low leakage current comprising:
a bulk silicon substrate;
a fence-shaped body which is formed by patterning the substrate and has a shape of a fence having predetermined height, width, and length;
an insulating layer which is made of an insulating material and is formed on a surface of the substrate to a first height of the fence-shaped body;
a gate insulating layer formed at side walls and an upper surface of the fence-shaped body protruding from the insulating layer;
a gate electrode formed on the gate insulating layer and the insulating layer to be perpendicular to a direction of the length of the fence-shaped body; and
source/drain formed at regions of the fence-shaped body where the gate electrode is not formed,
wherein the gate electrode includes a first gate electrode, a second gate electrode, and an isolation insulating layer disposed between the first and second gate electrodes, the second gate electrode has a work function lower than that of the first gate electrode, and the second gate electrode is formed at a side surface of the first gate electrode interposing the isolation insulating layer to be close to the drain.

10. The FinFET of claim 9, wherein the insulating layer comprises:
a thermal oxide layer formed on the substrate and the side surfaces of the fence-shaped body; and
a device isolating layer deposited on the thermal oxide layer to electrically isolate a corresponding device from an adjacent device.

11. The FinFET of claim 9, wherein a thickness of the gate insulating layer formed on the side surfaces and the upper portion of the fence-shaped body ranges from 0.5 to 200 nm at an internal channel, and the thickness of the gate insulating layer increases in directions to the source/drain so as to range 0.6 to 201 nm.

12. The FinFET of claim 9, wherein the first gate electrode and the second gate electrode are made of the same material and have different impurity doping types, made of different materials, or made of different materials and have different impurity doping types in order to have different work functions.

13. A FinFET having low leakage current comprising:
a bulk silicon substrate;
a fence-shaped body which is formed by patterning the substrate and has a shape of a fence having predetermined height, width, and length;
an insulating layer which is made of an insulating material and is formed on a surface of the substrate to a first height of the fence-shaped body;
a gate insulating layer formed at side walls and an upper surface of the fence-shaped body protruding from the insulating layer;
a gate electrode formed on the gate insulating layer and the insulating layer to be perpendicular to a direction of the length of the fence-shaped body; and
source/drain formed at regions of the fence-shaped body where the gate electrode is not formed,
wherein the gate electrode includes a first gate electrode and second gate electrodes respectively formed at both side surfaces of the first gate electrode, the second gate electrodes have work functions lower than that of the first gate electrode, and the second gate electrodes are formed at the both side surfaces of the first gate electrode to be close to the source/drain, respectively.

14. The FinFET of claim 13, wherein the insulating layer comprises:
a thermal oxide layer formed on the substrate and the side surfaces of the fence-shaped body; and
a device isolating layer deposited on the thermal oxide layer to electrically isolate a corresponding device from an adjacent device.

15. The FinFET of claim 13, wherein the first gate electrode and the second gate electrode are made of the same material and have different impurity doping types, made of different materials, or made of different materials and have different impurity doping types in order to have different work functions.

16. A FinFET having low leakage current comprising:
a bulk silicon substrate;
a fence-shaped body which is formed by patterning the substrate and has a shape of a fence having predetermined height, width, and length;
an insulating layer which is made of an insulating material and is formed on a surface of the substrate to a first height of the fence-shaped body;
a gate insulating layer formed at side walls and an upper surface of the fence-shaped body protruding from the insulating layer;
a gate electrode formed on the gate insulating layer and the insulating layer to be perpendicular to a direction of the length of the fence-shaped body; and
source/drain formed at regions of the fence-shaped body where the gate electrode is not formed,
wherein the gate electrode includes a first gate electrode, second gate electrodes formed at both side surfaces of the first gate electrode, respectively, and isolation insulating layers disposed between the first gate electrode and the second gate electrodes, respectively, the second gate electrodes have work functions lower than that of the first gate electrode, and the second gate electrodes are formed at the both side surfaces of the first gate electrode to be close to the source/drain, respectively.

17. The FinFET of claim 16, wherein the first gate electrode and the second gate electrode are made of the same material and have different impurity doping types, made of different materials, or made of different materials and have different impurity doping types in order to have different work functions.

* * * * *